(12) United States Patent
Hayashi et al.

(10) Patent No.: US 7,359,678 B2
(45) Date of Patent: Apr. 15, 2008

(54) SIGNAL PROCESSING SEMICONDUCTOR INTEGRATED CIRCUIT DEVICE AND WIRELESS COMMUNICATION SYSTEM

(75) Inventors: Norio Hayashi, Sawa (JP); Noriyoshi Hagino, Tomioka (JP); Toshiki Matsui, Takasaki (JP); Kazuo Watanabe, Takasaki (JP); Satoshi Tanaka, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 519 days.

(21) Appl. No.: 11/111,934

(22) Filed: Apr. 22, 2005

(65) Prior Publication Data

US 2005/0186927 A1    Aug. 25, 2005

Related U.S. Application Data

(63) Continuation of application No. 10/033,793, filed on Jan. 3, 2002, now Pat. No. 6,909,882.

(30) Foreign Application Priority Data

Jan. 12, 2001  (JP) .............................. 2001-005241

(51) Int. Cl.
*H04B 1/40* (2006.01)
(52) U.S. Cl. ................. 455/84; 455/73; 455/118; 455/127.3; 375/141; 375/345

(58) Field of Classification Search ............... 455/73, 455/118, 340, 131, 127.3, 144, 132, 324, 455/86; 375/141, 345, 146, 344
See application file for complete search history.

(56) References Cited

U.S. PATENT DOCUMENTS

| | | | |
|---|---|---|---|
| 5,557,641 A | 9/1996 | Weinberg | 375/295 |
| 5,819,161 A | 10/1998 | Saito | 455/86 |
| 5,822,366 A | 10/1998 | Rapeli | 375/219 |
| 5,898,907 A | 4/1999 | Maruyama | 455/76 |
| 6,115,157 A | 9/2000 | Barnard et al. | 398/1 |
| 6,212,244 B1 | 4/2001 | Davidovici et al. | 375/345 |
| 6,473,598 B1 | 10/2002 | Sepehry-Fard | 455/73 |
| 6,498,927 B2 | 12/2002 | Kang et al. | 376/405 |
| 6,549,766 B2 | 4/2003 | Vorenkamp et al. | 455/307 |
| 6,591,091 B1 | 7/2003 | Vorenkamp et al. | 455/179.1 |
| 6,728,514 B2 | 4/2004 | Bandeira et al. | 455/13.1 |

*Primary Examiner*—Tony T. Nguyen
(74) *Attorney, Agent, or Firm*—Miles & Stockbridge PC (57) ABSTRACT

The invention provides a signal processing semiconductor integrated circuit of the direct conversion system, which includes a dummy amplifier having the same circuit configuration as a low noise amplifier being the first stage amplifier, in which the DC offset calibrations on the subsequent stage amplifiers are carried out during shifting into the reception mode in a state that the low noise amplifier is deactivated and the dummy amplifier is activated. Thereby, the invention achieves to suppress generation of the DC offsets resulting from the leakage noises of the local oscillator during shifting into the reception mode, and to enhance the reception sensitivity.

21 Claims, 10 Drawing Sheets

SIGNAL PROCESSING SEMICONDUCTOR INTEGRATED CIRCUIT DEVICE AND WIRELESS COMMUNICATION SYSTEM

CROSS-REFERENCE TO RELATED APPLICATION

This application is a continuation of application Ser. No. 10/033,793 filed Jan. 3, 2002 now U.S. Pat. No. 6,909,882.

BACKGROUND OF THE INVENTION

The present invention relates to a technique effective for use in reducing a DC offset of a multi-stage connection amplifier in a semiconductor integrated circuit, specifically to a signal processing LSI (Large Scale Integrated semiconductor circuit) of the direct conversion system that processes transmission/reception signals, which is used in a portable telephone, for example.

Figure 10:
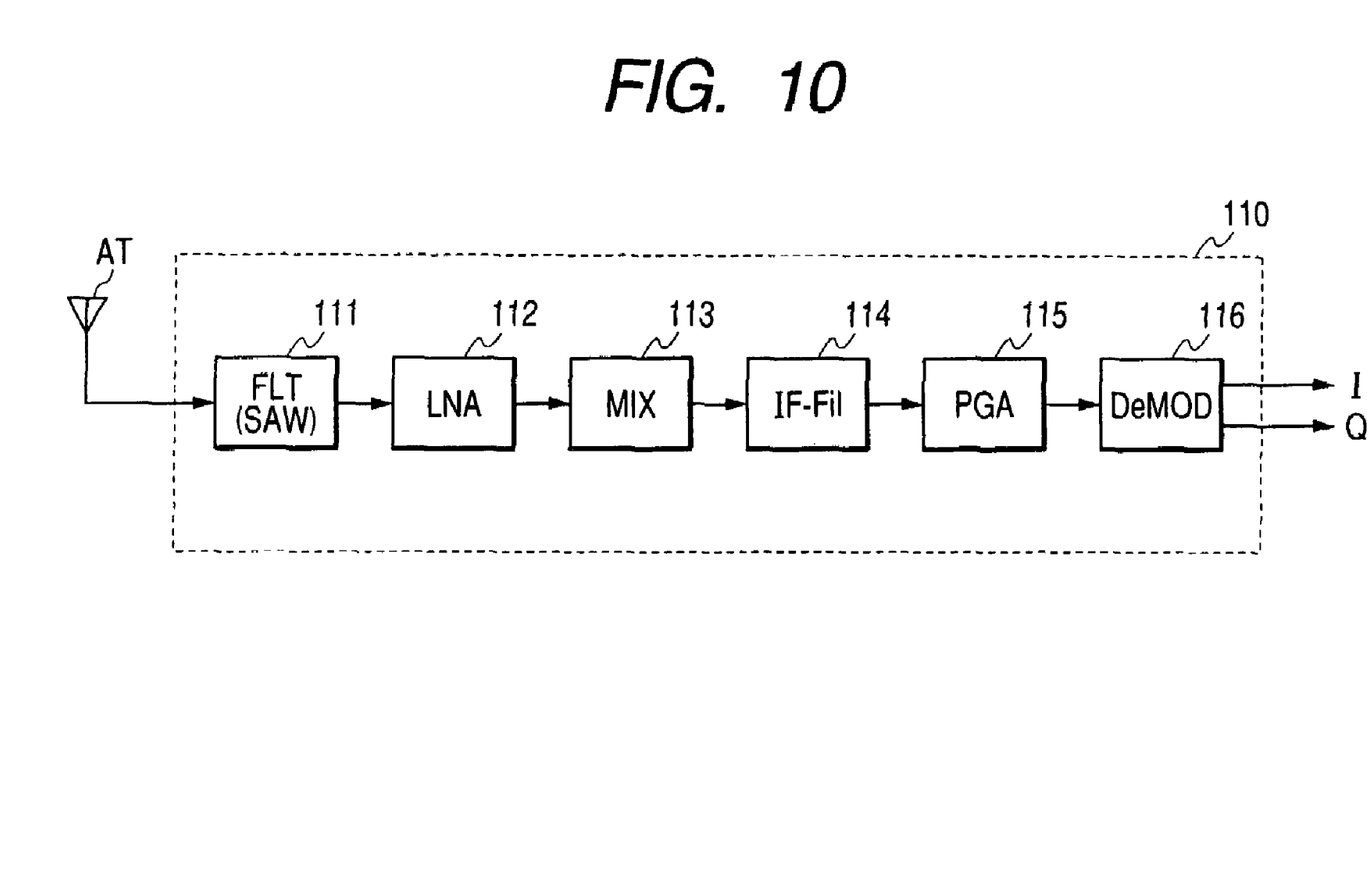
FIG. 10 is a block diagram of a reception circuit of the super-heterodyne system that is used in a portable telephone.

Traditionally, the so-called super-heterodyne system is adopted by a wireless communication LSI that processes transmission/reception signals, which is used in a portable telephone. As a reception circuit of the super-heterodyne system, the construction as shown in FIG. 10 can be put forth as an example. That is, the reception circuit includes a band restriction filter (FLT) 111 made up with a SAW filter that rejects spurious waves from signals received by an antenna AT, a low noise amplifier (LNA) 112 that amplifies a signal passed through the filter 111, a mixer (MIX) 113 that converts an amplified reception signal down to an intermediate frequency signal by synthesizing the amplified reception signal and a local oscillation signal from an oscillator 130 (not illustrated), a band pass filter (BPF) 114 that passes a signal of a frequency corresponding to the frequency difference of the reception signal and the local oscillation signal, a programmable gain amplifier (PGA) 115 that can amplify a signal to a desired level, and a demodulator (DeMOD) 116 that demodulates a signal having the amplitude regulated to a desired level into an audio-frequency base band signal (I/Q).

SUMMARY OF THE INVENTION

The super-heterodyne system first down-converts the reception signal into the intermediate frequency signal, and then carries out the demodulation, which inevitably expands the circuit scale. Accordingly, the inventor developed a signal processing LSI by the direct conversion system that directly down-converts the reception signal into the audio-frequency base band signal (I/Q) and demodulates. However, it was found that the direct conversion system has a deficiency that if there is a DC offset in the reception circuit, the DC offset is amplified and outputted. Then, the inventor examined the reason and found the following.

That is, generally the super-heterodyne system as shown in FIG. 10 takes on the alternate current (AC) coupling that transmits the reception signal through capacitors from the low noise amplifier (LNA) 112 to the pre-stage of the demodulator 116. Therefore, if there are DC offsets on the outputs of each stages, the AC coupling does not transmits the DC components, and the pre-stage Dc offsets do not give influence to the subsequent stages; and thereby the DC voltage fluctuations on the output of the final stage amplifier become extremely low.

Figure 11:
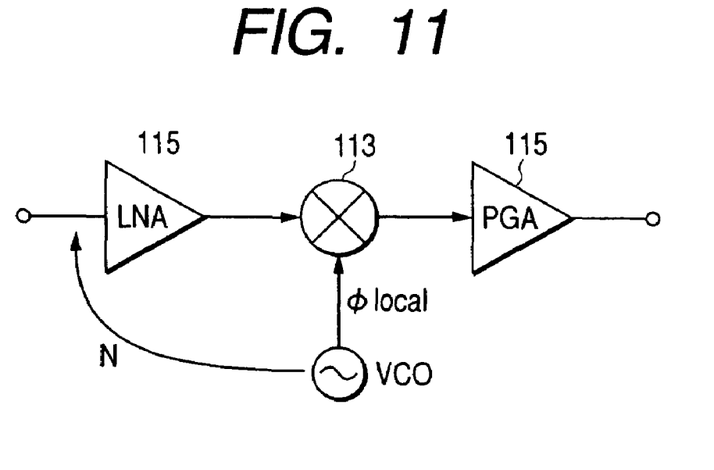
FIG. 11 is an explanatory chart of the self-mixing effect due to leaked noises of the local oscillation signal in the reception circuit of the direct conversion system.

On the other hand, the reception circuit of the direct conversion system has a construction as shown in FIG. 11, in which the band pass filter (BPF) 114 and the demodulator (DeMOD) 116 in FIG. 10 are omitted, and a reception signal such as 900 MHz and a local oscillation signal φ local having almost the same frequency as the former are synthesized by the mixer 113 to be directly down-converted into the audio-frequency (0 to 70 kHz) signal and be demodulated.

On that account, the output of the mixer 113 has to be connected in DC (direct current) coupling to the input of the programmable gain amplifier (PGA) 115, and if a DC offset due to the dispersions of the elements appears on the output of the mixer 113, the programmable gain amplifier 115 will amplify the DC offset. Since the total gain of the programmable gain amplifier 115 exceeds 1500 times, the DC offset is amplified in the same magnification, which confirmed the lowering of the reception sensitivity.

Therefore, the reception circuit of the direct conversion system is required to calibrate the DC offset to a specific value, for example, zero in the programmable gain amplifier 115 before starting the reception. However, in performing the calibration, disturbing waves from the antenna will disable the correct calibration, and it was devised that, in the mean time, the first stage LNA 112 is made OFF (inactive).

However, even if the calibration is carried out in the state of the first stage LNA 112 being inactive, since the frequency of the reception signal RF synthesized by the mixer 113 and the frequency of the local oscillation signal φ local are almost equal in the reception circuit of the direct conversion system, there occurs the following problem. That is, as shown in FIG. 11, when a noise N from the oscillator VCO is leaked into the input of the LNA 112, the mixer 113 synthesizes the leaked noise N and the local oscillation signal φ local being the cause of the noise to create the self-mixing phenomenon. However, since the frequencies are almost equal, the filter circuit of the reception system is unable to eliminate the DC offset. As the result, the DC offset resulting from the noises around the LNA 112 by the local oscillation signal is to be amplified by the programmable gain amplifier 115, which confirmed the possibility that the reception sensitivity be lowered.

It is therefore an object of the invention to suppress generations of the DC offset due to leaked noises from the local oscillator during the shift to the reception mode to thereby enhance the reception sensitivity, in the signal processing semiconductor integrated circuit of the direct conversion system.

The aforementioned and other objects of the invention and the novel features thereof will become apparent from the descriptions and accompanying drawings of this specification.

The summary of the typical inventions of those disclosed in the present application will be briefly explained as follows.

According to an aspect of the invention, the signal processing semiconductor integrated circuit is provided with a reception circuit including a fist amplifier that amplifies a reception signal, a frequency conversion means that synthesizes an amplified signal and an oscillation signal of a specific frequency to convert them into an audio frequency base band signal, and a second amplifier DC-coupled with the frequency conversion means, which amplifies the frequency converted signal by the frequency conversion means. Further, the signal processing semiconductor integrated circuit incorporates a third amplifier (dummy LNA) having almost the same circuit configuration as that of the first amplifier, the output terminal of the third amplifier is connected to an input terminal of a circuit on the subsequent stage, the output terminal of the first amplifier is connected to the above input terminal, and the input terminal of the third amplifier is not connected to a terminal to which the reception signal is inputted.

According to the foregoing means, in the signal processing semiconductor integrated circuit of the direct conversion system, for example, a DC offset calibration is carried out in a variable gain amplifier being the second amplifier in the state that a low noise amplifier being the first amplifier is deactivated and the dummy LNA being the third amplifier is activated instead thereof. Thereafter, a reception operation is started in the state that the dummy LNA is deactivated and the low noise amplifier being the first amplifier is activated. Thereby, the calibration can be performed in the state that the leakage noises from the oscillator or the roundabout noises of the oscillation signal are applied through the dummy LNA. Thus, the DC offset resulting from the device dispersion and the DC offset caused by the self-mixing can be calibrated at the same time.

Further, it is preferable to configure such that an impedance equivalent to that of an external circuit connected to the input terminal of the first amplifier is connected to the input terminal of the third amplifier. Thereby, the calibration can be carried out by the third amplifier giving the same noises as the leakage noises of the oscillation signal that come in to the input terminal of the first amplifier during the normal operation mode. Therefore, the DC offset of a still higher accuracy becomes possible, and a higher sensitivity reception can be achieved in the communication system.

Further, it is preferable to configure such that the third amplifier is deactivated and the first amplifier is activated after the DC offset is calibrated. Thereby, the roundabout noises of the oscillation signal from the dummy LNA, being the third amplifier are cut off during the normal operation mode, so that the DC offset of a still higher accuracy becomes possible, and useless power consumption can be reduced.

Further, when there are plural stages in the second amplifier, each of the stages may be provided with the calibration circuit that calibrates the DC offset on the output. Thereby, the DC offset of a still higher accuracy becomes possible.

Further, according to another aspect of the invention, the signal processing semiconductor integrated circuit includes: the reception circuit having the construction as mentioned above; a transmission circuit including a modulation circuit that modulates a transmission signal, and an up-converting frequency conversion means that synthesizes a modulated signal and an oscillation signal to convert them into a higher frequency signal; a control circuit that controls the reception circuit and the transmission circuit; and an oscillation circuit that generates the oscillation signal synthesized by the reception circuit and the transmission circuit, or an oscillation control signal; and all these components are formed on one semiconductor substrate. Thereby, one-chip transmission/reception LSI can be realized, which accomplishes reduction of the number of components in the communication system, enhancement of the packaging density, and miniaturization of a portable telephone, etc.

Further, according to another aspect of the invention, the wireless communication system includes: the one-chip signal processing semiconductor integrated circuit as mentioned above; and a base band circuit formed on a semiconductor substrate, which implements a signal processing, namely a conversion from a reception base band signal into an audio signal and a conversion from the audio signal into the base band signal, and a control of the signal processing semiconductor integrated circuit. Further, the above system is constructed such that the base band circuit supplies the signal processing semiconductor integrated circuit with a command signal to activate a reference voltage generation circuit that generates a bias voltage to a current source for supplying operation currents to the frequency conversion means and the second amplifier, and a command signal to activate the frequency conversion means and the second amplifier. With this system, it will become needless to prepare a control LSI such as a microprocessor that controls the whole system, separately from the base band circuit, which makes it possible to reduce the number of components in the communication system, to enhance the packaging density, and to miniaturize a portable telephone, etc.

Further, it is preferred to configure such that the command signal to activate the reference voltage generation circuit and the command signal to activate the frequency conversion means and the second amplifier are supplied from the base band circuit to the control circuit inside the signal processing semiconductor integrated circuit. With this arrangement, the base band circuit will only need to supply the commands to the control circuit inside the signal processing semiconductor integrated circuit, and will not need to supply directly to the circuits inside the signal processing semiconductor integrated circuit, which reduces the number of the signal lines between the base band circuit and the signal processing semiconductor integrated circuit, and the number of the external terminals.

Further, according to another aspect of the invention, the control method in a signal processing semiconductor integrated circuit is implemented such that the DC offset of the second amplifier is calibrated in a state that the first amplifier is deactivated and the third amplifier is activated, while the second operation mode shifts into the first operation mode, whereas the signal processing semiconductor integrated circuit includes a reception circuit including a fist amplifier that amplifies a reception signal, a frequency conversion means that synthesizes an amplified signal and an oscillation signal of a specific frequency to convert them into an audio frequency base band signal, and a second amplifier DC-coupled with the frequency conversion means, which amplifies the frequency converted signal by the frequency conversion means, and further incorporates a third amplifier having almost the same circuit configuration as that of the first amplifier, in which the output terminal of the third amplifier is connected to an input terminal of a circuit on the subsequent stage, the output terminal of the first amplifier is connected to the above input terminal, and the input terminal of the third amplifier is not connected to a terminal to which the reception signal is inputted.

With the adoption of the control method, in the signal processing semiconductor integrated circuit having the first operation mode in which the reception circuit is activated and the second operation mode in which the reception circuit is deactivated, it will become possible to perform a high-accuracy calibration of the DC offset created in the second amplifier, in shifting from the first operation mode such as the idle mode into the second operation mode such as the reception mode, which achieves a stabilized reception characteristics and enhances the reception sensitivity in the wireless communication system.

DESCRIPTION OF THE PREFERRED EMBODIMENTS

The preferred embodiments of the invention will now be described with reference to the accompanying drawings.

Figure 1:
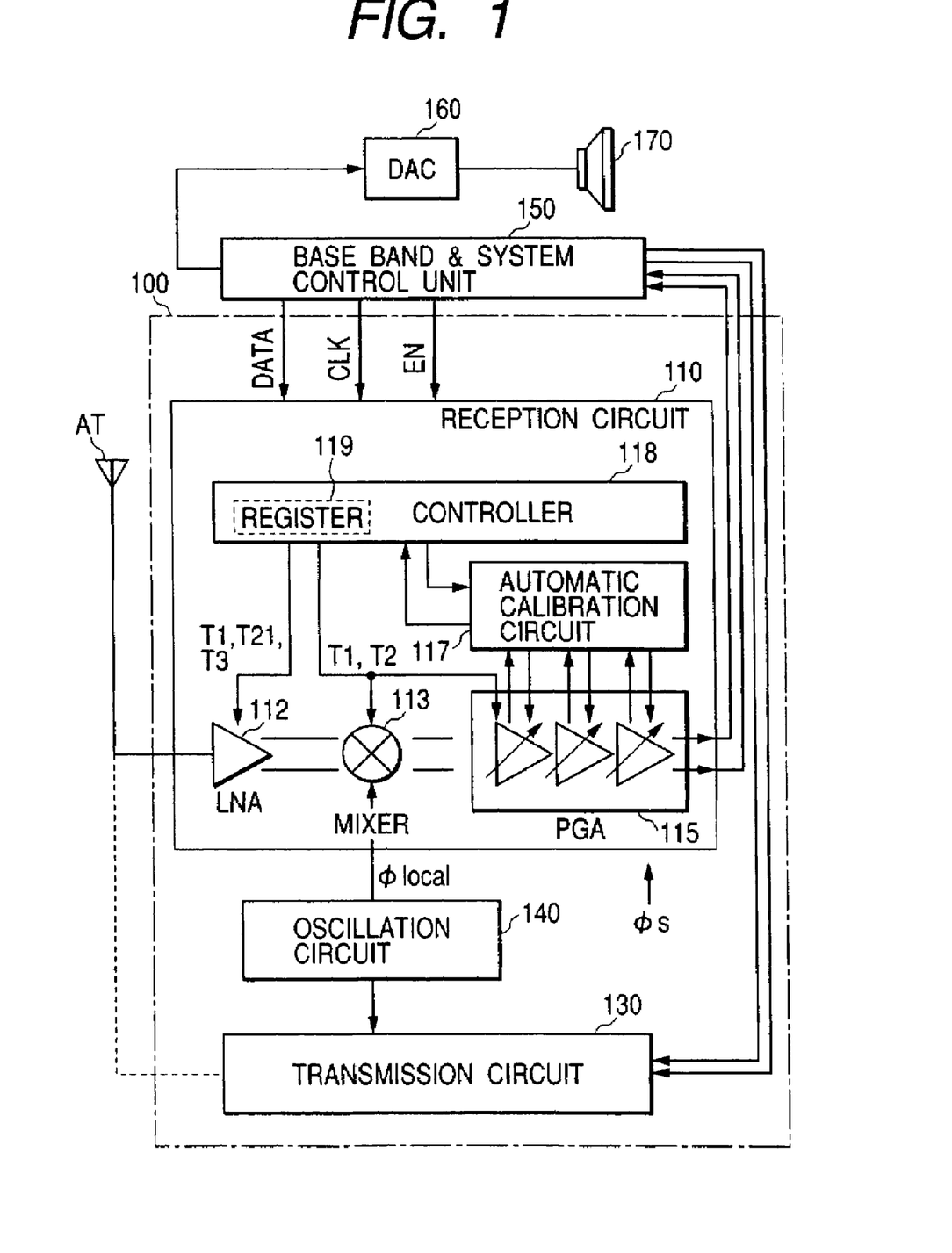
FIG. 1 is a block diagram of a signal processing system for a portable telephone, illustrating the embodiment being suitable for the application of the present invention.

FIG. 1 illustrates a configuration of a signal processing system for a portable telephone, which is a preferred embodiment for the application of the invention.

In FIG. 1, AT signifies a transmission/reception antenna for communication radio waves, 110 a reception circuit of the direct conversion system that demodulates a signal received by the antenna AT without intervention of the intermediate frequency, and amplifies and converts the demodulated into a base band signal, 130 a transmission circuit that modulates the base band signal to be transmitted from the antenna AT and converts the frequency, 140 an oscillation circuit that generates the local oscillation signal φ local that is essential to the frequency conversion in the reception circuit 110 and the transmission circuit 130, 150 a base band & system control unit that implements a signal processing such as the conversion from a reception base band signal into an audio signal and the conversion from an audio signal into a base band signal, and controls the reception circuit 110 and the transmission circuit 130. The audio data outputted from the base band & system control unit 150 is converted into an analog signal by a D/A converter 160 and supplied to a speaker 170, where the audio sounds are reproduced.

The reception circuit 110 is made up with a low noise amplifier (LNA) 112 that amplifies a signal received by the antenna AT, a mixer (MIX) 113 that synthesizes an amplified reception signal and a local oscillation signal whose frequency is divided into the same frequency as that of the reception signal, thereby down-converts the two signals directly into an audio-frequency base band signal, and demodulates it, a high-gain PGA unit 115 that possesses plural stages of the gain controllable, programmable gain amplifiers (PGA) and low pass filters (LPF), and amplifies a signal to a specific level, an automatic calibration circuit 117 that implements the DC offset calibration of the PGA unit 115, and a controller 118 that implements the operation control of the reception circuit 110 and the transmission circuit 130 on the basis of the commands and the like from the base band & system control unit 150.

The base band & system control unit 150 is connected to the controller 118 of the reception system through a serial bus composed of three signal lines. The base band & system control unit 150 supplies the controller 118 of the reception system with a command code DATA and a clock CLK that gives a latch timing of the command and an enable signal EN that indicates the data to be valid. The controller 118 carries out the operation control of the reception circuit 110 on the basis of the commands supplied.

On the pre-stage of the low noise amplifier (LNA) 112 is provided a SAW filter that removes spurious waves from a signal received by the antenna AT, which is not illustrated in FIG. 1. In this embodiment, although not confined specifically, the reception circuit 110, the transmission circuit 130, and the oscillation circuit 140 are formed on one semiconductor substrate such as a single crystal silicon as a semiconductor integrated circuit 100, except for the SAW filter and the filter capacitors and the like. Also, the base band & system control unit 150 is made up in a semiconductor integrated circuit in itself, however the base band circuit and the system control circuit may be configured in separate semiconductor integrated circuits.

Figure 2:
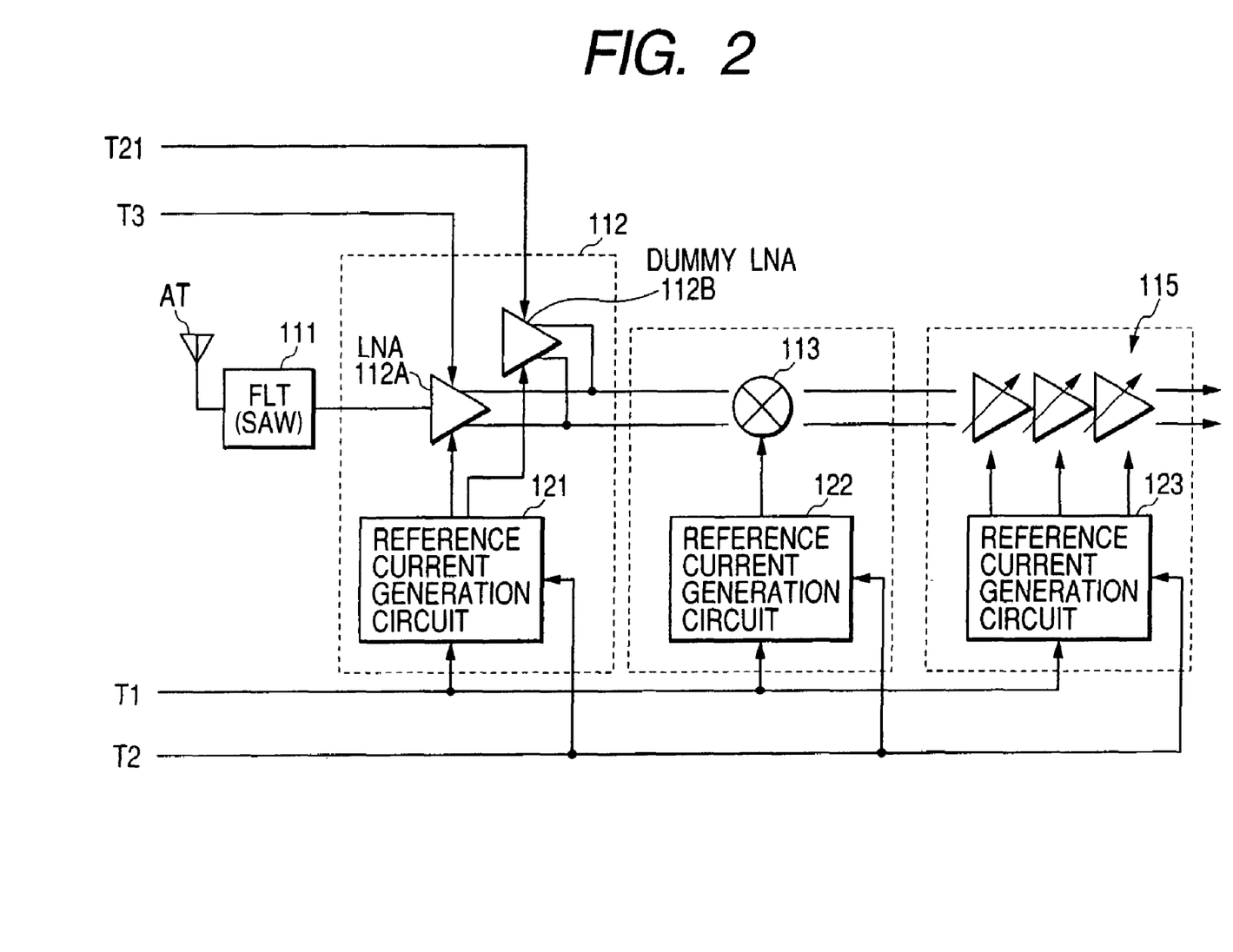
FIG. 2 is a detailed block diagram illustrating a drive system of a signal reception unit in a reception circuit 110.
Figure 3:
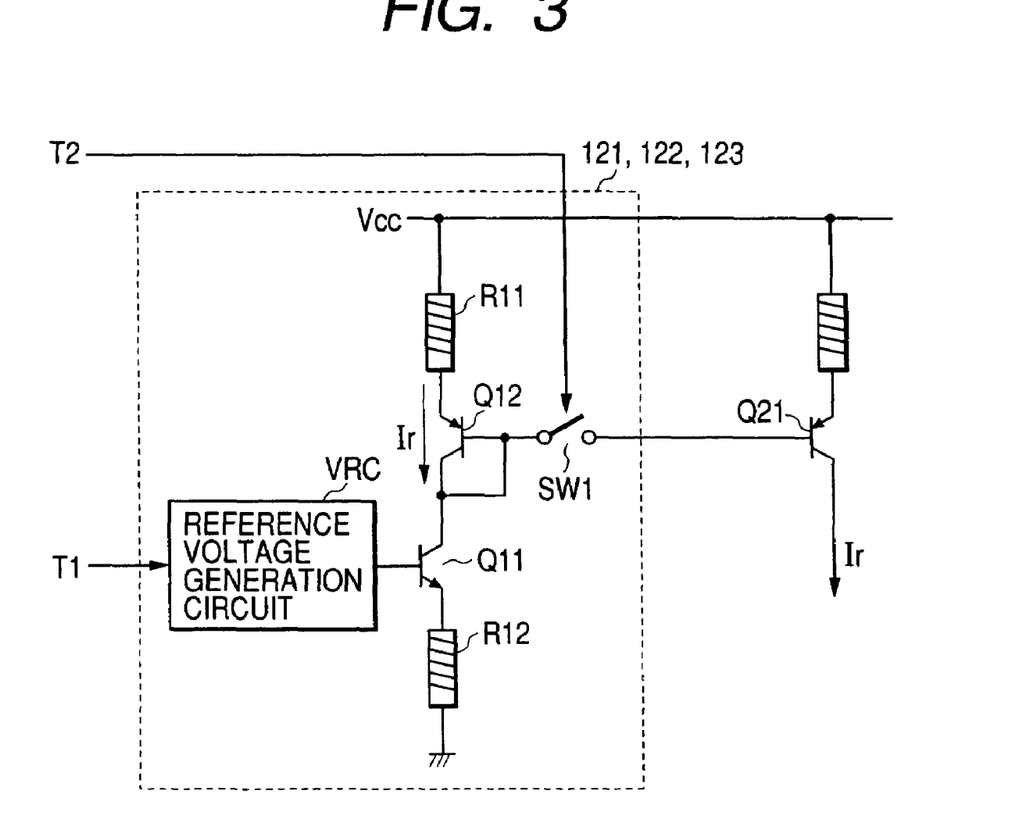
FIG. 3 is a block diagram illustrating an example of a reference current generation circuit in FIG. 2.

FIG. 2 illustrates a more concrete configuration of the reception circuit 110, and FIG. 3 illustrates a concrete configuration of a reference current generation circuit that supplies operation currents to the amplifiers on individual stages that constitute the reception circuit.

In this embodiment are provided a low noise amplifier 112A essential to an LNA unit 112 and a dummy LNA 112B having the same circuit configuration as the LNA 112A. And, the PGA unit 115 is provided with three programmable gain amplifiers PGA1, PGA2, PGA3, and as will be described later, these amplifiers are cascaded with filters inserted between them. And, the low noise amplifier 112A and the dummy LNA 112B, the mixer 113, and the programmable gain amplifiers PGA1, PGA2, PGA3 are provided with reference current generation circuits 121, 122, 123, respectively, which generate reference currents necessary for supplying the operation currents to the amplifiers.

The reference current generation circuit 121 to 123 is made up, as shown in FIG. 3, with a reference voltage generation circuit VRC such as a band gap reference circuit, a bipolar transistor Q11 that receives a generated reference voltage Vref at the base thereof, a resistor R11 connected between the power supply voltage VCC and the collector of the transistor Q11 and a current mirror transistor Q12 whose base and collector are coupled, and a resistor R12 connected between the emitter of the transistor Q11 and the ground. The circuit composed of the resistors R11, R12, and the transistors Q11, Q12 functions as the voltage-to-current conversion circuit.

Further, the base of the transistor Q12 is connected to the base of a transistor Q21 furnished as a constant current source to the amplifier on each stage, whereby a current mirror circuit is configured. Thereby, the equal current to the reference current Ir of the reference current generation circuit 121 to 123 is made to flow into the constant current source for the amplifier on each stage.

Further, between the reference current generation circuits 121, 122, 123 and the transistor Q21 as a current source that supplies the operation current to the amplifier on each stage is inserted a switch SW1 that determines to or not to transmit the base voltage of the transistor Q12 of the voltage-to-current conversion circuit. This switch SW1 is controlled by a control signal T2 from the controller 118. However in the LNA unit 112, as will be described in detail later, the reference current generation circuit 121 provided in correspondence with the low noise amplifier 112A and the dummy LNA 112B is configured to transmit the reference current to either one of the circuits by the switches installed in the low noise amplifier 112A and the dummy LNA 112B.

Further, the reference voltage generation circuit VRC in the reference current generation circuit 121 to 123 is configured in such a manner that the reference voltage generation circuit VRC can be switched into the active state or the inactive state by the control signal T1 from the controller 118, in order to reduce the power consumption, when, for example, the system comes into the idle mode and the reception circuit 110 is in the halt of operation.

The reception circuit in this embodiment first activates the reference voltage generation circuit VRC by the control signal T1, after the reference voltage becomes stabilized, turns the switch SW1 ON to flow the current into the current source of the amplifier on each stage, and thereby prevents the fluctuations of the DC offset. Further, with regard to the LNA 112, the low noise amplifier 112A and the mixer 113 are AC-coupled through a capacitor, and the fluctuations of the DC offset in the low noise amplifier 112A will not be transmitted to the mixer 113. Therefore, the switch SW1 on the output of the reference current generation circuit 121, which is provided in correspondence with the low noise amplifier 112A, may be omitted.

On the other hand, the controller 118 of the reception circuit 110 is made up with a register 119 that stores the command codes from the base band & system control unit 150 and the like, a decoder that outputs control signals to the inner circuits on the basis of the values of the register 119, and a logic circuit that generates control signals at specific timings on the basis of the commands supplied from the base band & system control unit 150 and the signals of the calibration ending notice outputted from the automatic calibration circuit 117, and the like.

The controller 118 generates, at specific timings under specific conditions, the control signal T1 that activates the reference voltage generation circuits VRC of the low noise amplifier 112A, the dummy LNA 112B, the mixer 113, and the PGA unit 115 on the basis of the commands supplied, the control signal T2 that makes the reference current generation circuit 121 to 123 supply the reference current generated therein to the corresponding amplifier, the automatic calibration control signal T21 that activates the dummy LNA 112B and makes the automatic calibration executable, and the reception control signal T3 that activates the low noise amplifier 112A to receive the signals.

Figure 4:
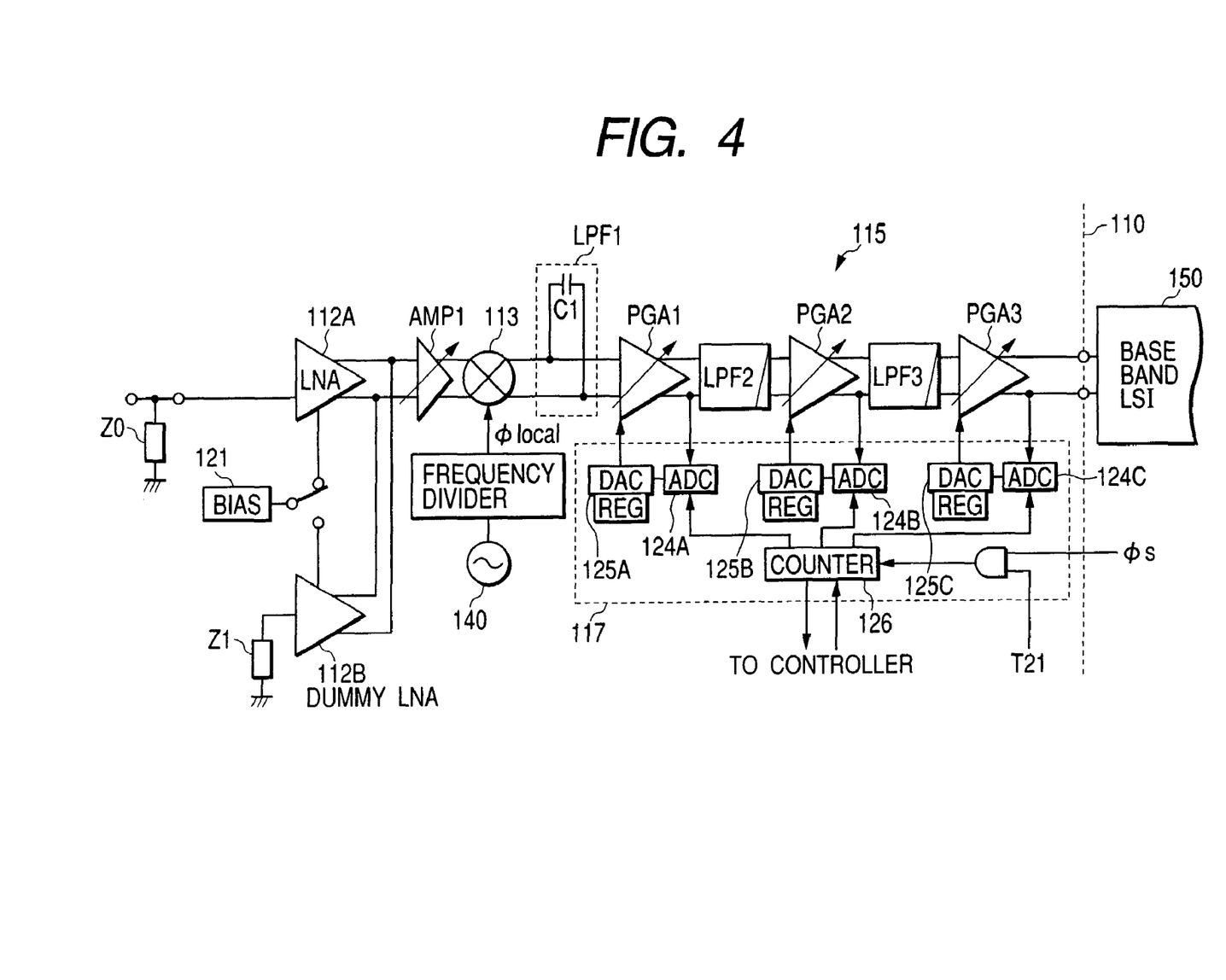
FIG. 4 is a detailed block diagram illustrating the signal reception unit including an automatic calibration circuit 117.

FIG. 4 illustrates a more detailed block diagram of the reception circuit 110.

As illustrated in FIG. 4, the PGA unit 115 has a configuration such that the low pass filters LPF1 to LPF3 to cut out the high frequency noises and the gain controllable programmable gain amplifiers PGA1 to PGA3 are alternately cascaded. The low pass filters LPF1 to LPF3 are each designed in such a manner that the inclination of the gain characteristic curve near the cutoff frequency becomes sharper on the second stage than on the first stage, and becomes still sharper on the third stage than on the second stage.

Here, the low pass filters LPF1 on the first stage is composed of the load on the output of the mixer 113 and an externally mounted capacitor C1. The capacitance of the capacitor C1 is comparably high (for example, 2200 pF), so that it is externally mounted. The low pass filters LPF2 on the second stage is a filter of degree two, and the low pass filters LPF3 is a filter of degree three. The capacitances of the capacitors constituting these filters are comparably low, and they can be formed on the semiconductor substrate together with elements constituting the amplifiers.

The programmable gain amplifiers PGA1 to PGA3 are designed to attain a high gain such as 1600 times with three stages. In the direct conversion system, since the signal on the post stage of the mixer 113 is the base band signal of 0 Hz to 70 kHz, the circuits on the post stage of the mixer 113, such as the low pass filters LPF1 to LPF3 and the programmable gain amplifiers PGA1 to PGA3, cannot be coupled with capacitors, and they are DC-coupled.

The automatic calibration circuit 117 is provided in correspondence with each of the programmable gain amplifiers PGA1 to PGA3, which is composed of AD converters 124A to 124C that convert potential differences of the programmable gain amplifiers PGA1 to PGA3 each into digital signals, DA converters 125A to 125C that give input offsets to bring the DC offsets on the outputs thereof into zero to the differential inputs of the corresponding programmable gain amplifiers PGA1 to PGA3 on the basis of the comparison results by the AD converters 124A to 124C, and a counter 126 that gives operation timings to each of the DA converters 125A to 125C, and the like.

The automatic calibration circuit 117, starting the calibration according to the command from the controller 118, first executes the DC offset calibration of the first stage programmable gain amplifiers PGA1, after completing the first stage, next executes the second stage, and then goes to the third stage, thus carrying out the calibration one stage after another.

The DC offset calibration on each stage adopts the method of successive approximation that executes the comparisons of the differential outputs of the amplifiers by the AD converters 124A to 124C and the voltage applications to the amplifiers by the DA converters 125A to 125C repeatedly one after another, which is not confined specifically. The DA converters 125A to 125C can output to select one out of the voltage values of $2^n$ steps, by synthesizing the weighted currents of n-types (n: positive integer, for example, 6) of which the current values are in the relation of i, $2i$, $4i$, $8i$ . . . , in correspondence with the input signals of n-bits and converting them into the voltages.

Further, the AD converters 124A to 124C compare the outputs of the amplifiers with the reference voltages on the basis of the timing signals from the counter 126, and the DA converters 125A to 125C apply the voltages according to the comparison results by the AD converters 124A to 124C to the inputs of the differential amplifiers; and, the above comparisons and voltage applications are repeated six times, for example, whereby the calibration of each of the programmable gain amplifiers PGA1 to PGA3 is carried out. After the completion of the calibration, the controller 118 makes registers furnished with the DA converters 125A to 125C store the final DA input values that need to bring each of the DC offsets of the amplifiers into zero, and controls to maintain the state until the next calibration or until the reception mode comes to an end.

In the foregoing calibration operation, the counter 126 counts a system clock $\phi s$ on the basis of the control signal from the counter 118, and generates to output the timing signal for the first stage AD converter 124A, the timing signal for the second stage AD converter 124B, and the timing signal for the third stage AD converter 124C one after another, whereby the DC offset calibrations on each stages are performed sequentially. When the DC offset calibration is completed, the counter 126 is made to output a signal to inform of the completion to the controller 118.

Here in this embodiment, although not confined specifically, with regard to the second stage amplifier PGA2 and the third stage amplifier PGA3, resistors are attached to the input terminals thereof to make the input offsets adjustable, and the input offsets can be varied to bring the DC offsets into zero by checking the output voltages; and on the other hand, with regard to the first stage amplifier PGA1, the output is configured adjustable to bring the DC offset into zero by checking the output voltage.

Figure 5:
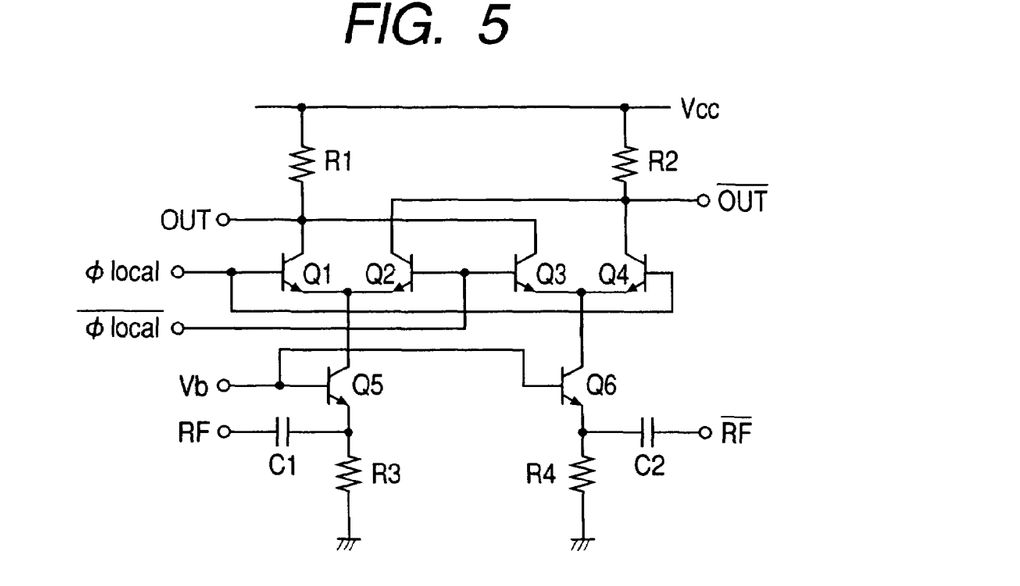
FIG. 5 is a circuit diagram illustrating an example of a mixer 113.

FIG. 5 illustrates a circuit example of the mixer 113. The mixer 113 of this embodiment includes two pairs of differential input transistors Q1, Q2; Q3, Q4 of which emitters are jointly connected each other, to which bases differential local oscillation signals φ local, φ local are inputted, and of which collectors on one side are cross-coupled, a resistor R1 connected between the collector of Q1 and the supply voltage VCC, a resistor R2 connected between the collector of Q4 and the supply voltage VCC, a constant current transistor Q5 and a resistor R3 connected to the emitter thereof that are connected in series between the jointly connected emitters of Q1 and Q2 and the ground, and a constant current transistor Q6 and a resistor R4 connected to the emitter thereof that are connected in series between the jointly connected emitters of Q3 and Q4 and the ground. And, differential reception signals RF, /RF are inputted through capacitors C1, C2 to the nodes that connect the emitters of the constant current transistors Q5, Q6, respectively, to the resistors R3, R4. And, the synthesized frequency signal of the local oscillation signals φ local, /φ local and the reception signals RF, /RF is obtained from the collectors of the differential input transistors Q1, Q4 as the differential output.

Figure 6:
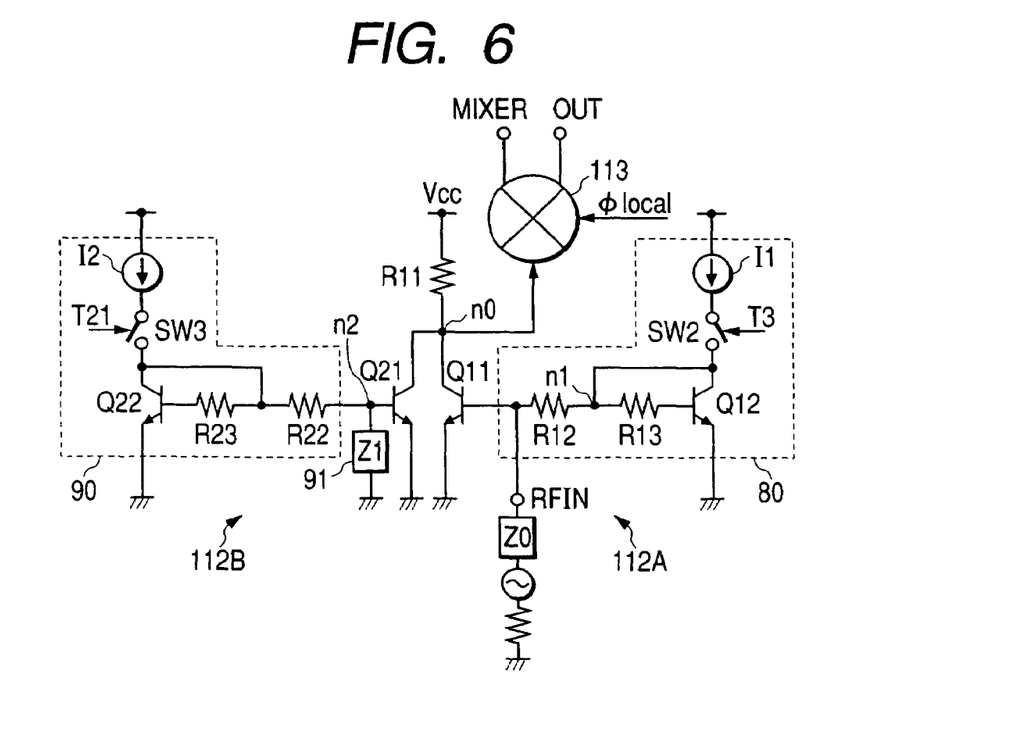
FIG. 6 is a circuit diagram illustrating a detailed example of a LNA circuit 112A and a dummy LNA 112B.

FIG. 6 illustrates a circuit example of the low noise amplifier 112A and the dummy LNA 112B that are placed on the input area of the reception circuit 110. The dummy LNA 112B has the same circuit construction and uses the elements of the same characteristics as the low noise amplifier 112A, as previously mentioned.

The low noise amplifier 112A is composed of, as shown in FIG. 6, a grounded emitter amplifier having a resistor R11 and a bipolar transistor Q11 connected in series between the supply voltage VCC and the ground, and a bias circuit 80 that flows a bias current into the transistor Q11, including a transistor Q12 of which base is jointly connected to the base of the transistor Q11 to form a current mirror circuit, and a constant current source 11 connected in series to the transistor Q12. The bias circuit 80 is furnished with a switch SW2 between the constant current source 11 and the transistor Q12 to cut off the current from the constant current source 11.

Further, in the bias circuit 80, the base of the transistor Q12 is connected to the base of the transistor Q11 through the resistors R12, R13, and the collector of the transistor Q12 is connected to the node n1 of these resistors R12, R13, whereby the transistor Q11 and the transistor Q12 form a current mirror. The base of the transistor Q11 is connected to an external input terminal RFIN where the reception signal from the antenna AT is inputted.

In the low noise amplifier 112A thus configured, in the state that the transistor Q11 flows a collector current by the bias current from the bias circuit 80, when the reception signal is inputted to the base of the transistor Q11 from the external input terminal RFIN, an amplified signal of the inputted signal appears at the node n0 of the transistor Q11 and the resistor R11, which is supplied to the mixer 113.

And, when the switch SW2 is turned OFF by the control signal T3 from the controller 118 and the current is cut off, the collector current of the transistor Q11 is cut off as well, and the base potential of the transistor Q11 is lowered to the ground potential. Consequently, a minute reception signal is not able to drive the transistor Q11, and the low noise amplifier 112A is brought into the inactive state.

The dummy LNA 112B is formed into the same circuit construction with the elements of the same characteristics as the low noise amplifier 112A. Concretely, the dummy LNA 112B is composed of a dummy input transistor Q21 placed in parallel to the transistor Q11, having the resistor R11 as the common load for both, and a bias circuit 90 having the same construction as the bias circuit 80 on the low noise amplifier 112A, which includes a transistor Q22 forming a current mirror circuit with the transistor D21, resistors R22, R23 connected between the bases of the transistors Q21, Q22, a switch SW3 connected to the collector of the transistor Q22, and a constant current source 12. Here, the switch SW3 furnished with the dummy LNA 112B is controlled by the control signal T21 from the controller 118 during performing the calibration, complementarily with the switch SW2 of the proper low noise amplifier 112A. In other words, it is controlled in a manner that SW3 is ON when SW2 is OFF, and SW3 is OFF when SW2 is ON.

Further, to the node n2 of the dummy LNA 112B corresponding to the input terminal RFIN of the low noise amplifier 112A is connected a matching circuit 91 having an impedance Z1 virtually equivalent to an impedance Z0 of a circuit including an inductor and a capacitor that are externally attached to the input terminal RFIN, in a manner that the impedance connected to the base of the transistor Q21 becomes equal to the impedance connected to the base of the transistor Q11. Here, since it is difficult to form an inductor on a semiconductor substrate, the equivalent impedance Z1 is designed by a resistor and a capacitor so as to attain the virtually equivalent impedance in relation to the frequency ω in of the signal being taken in the internal circuit from the input terminal RFIN.

Further, it is general to form the low noise amplifier 112A in an area remote from the local oscillation circuit 140 and the mixer 113 on the semiconductor substrate, in order to make the leakage noises form the local oscillator difficult to penetrate into the low noise amplifier 112A, and it is also recommendable to form the dummy LNA 112B in the same area.

Further, the circuit configuration of the low noise amplifier 112A and the dummy LNA 112B, and the circuit configuration of the surrounding circuits thereof are not limited to the one as illustrated in FIG. 6. It is possible to configure a variable gain amplifier AMP1 (see FIG. 4) capable of switching the gain of itself by two steps which is inserted between the low noise amplifier 112A and the mixer 113, and switch the gain of the variable gain amplifier AMP1 into the lower by the control of the base band & system control unit 150 when the amplitude of the reception signal is large, and switch the gain of the variable gain amplifier AMP1 into the higher by the control of the base band & system control unit 150 when the amplitude of the reception signal is small.

Figure 7:
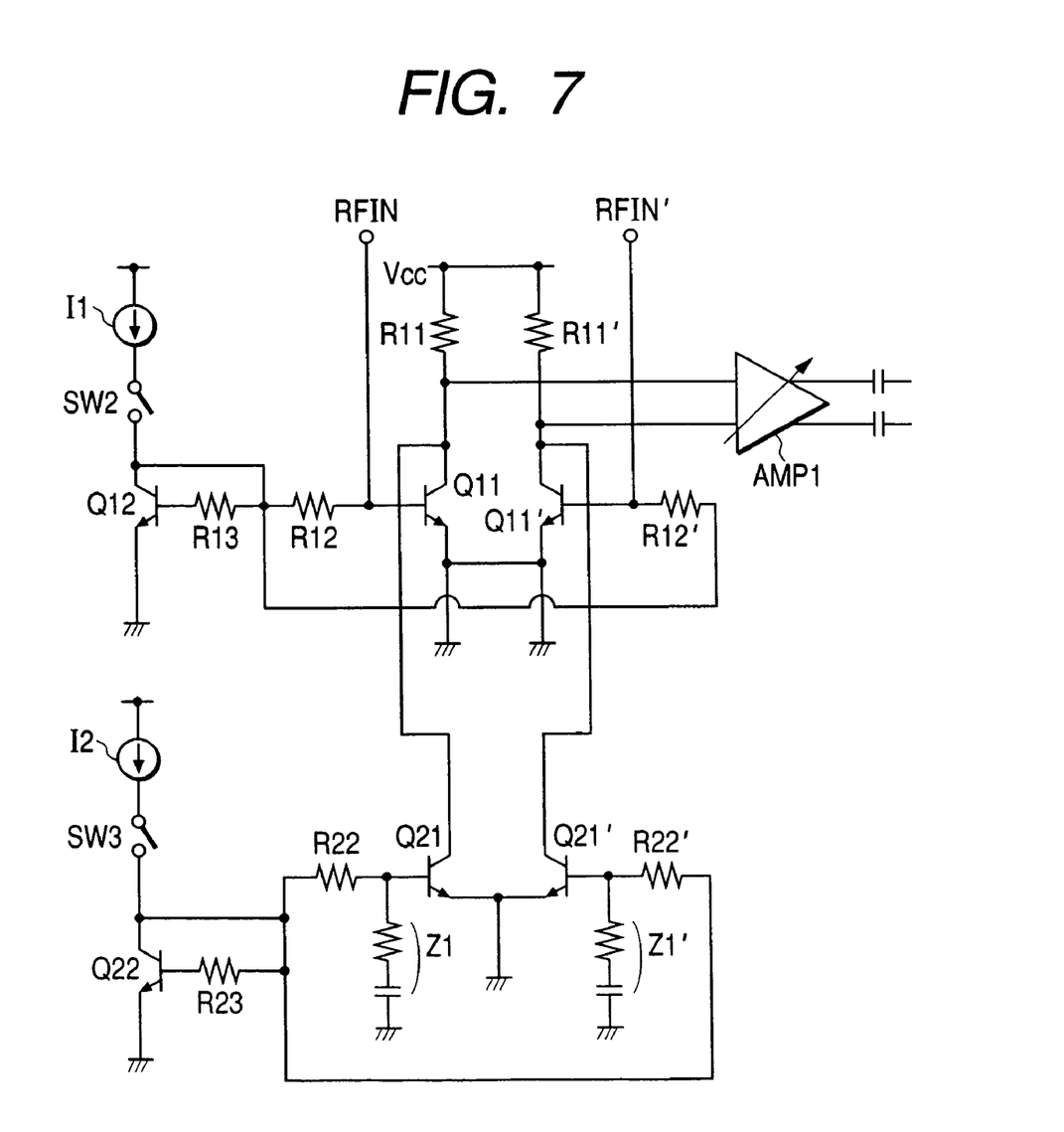
FIG. 7 is a circuit diagram illustrating an example of a differential LNA circuit 112A and the dummy LNA 112B.

It is also possible to configure the low noise amplifier 112A into a differential type, and convert the reception signal received by the antenna AT into a differential signal and input the converted differential reception signal to the differential low noise amplifier 112A. FIG. 7 illustrates such differential low noise amplifier 112A and dummy LNA 112B that are applicable to the above case. Here, the circuit in FIG.

7 is a differential type of the circuit in FIG. 6, the basic configuration thereof is the same as that of the circuit in FIG. 6, and the detailed explanation will be omitted. And, in the example in FIG. 7, the emitters of the input transistors Q11, Q11' of the low noise amplifier 112A are connected to grounding lugs provided for the external terminals, which makes it possible to reduce the noises surrounding the ground line. On the other hand, the emitters of the input transistors Q21, Q21' of the dummy LNA 112B are connected to the ground line inside the chip.

Figure 8:
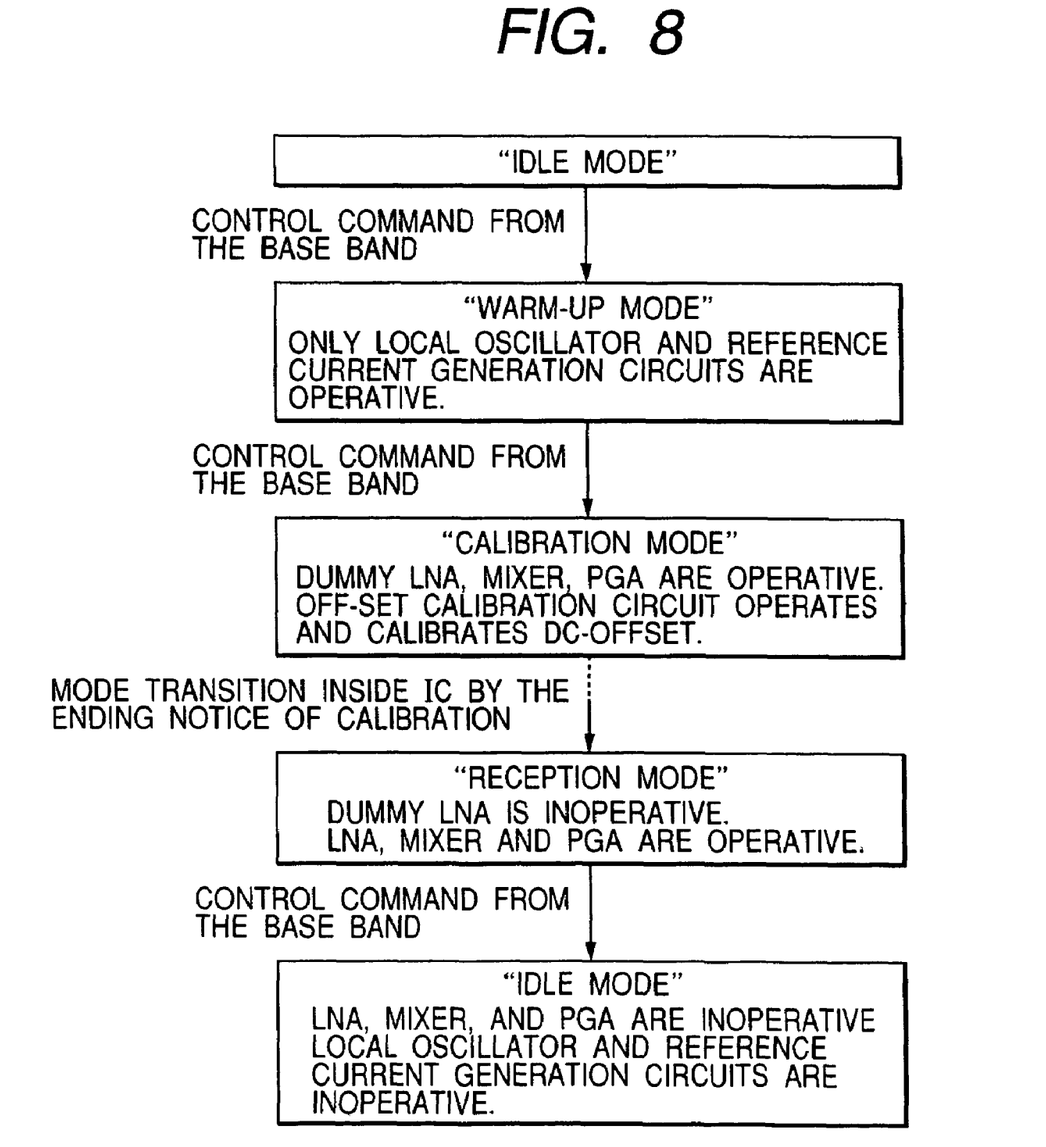
FIG. 8 is a flow chart illustrating a processing procedure during the switching of the idle mode and the reception mode in the signal reception unit.
Figure 9:
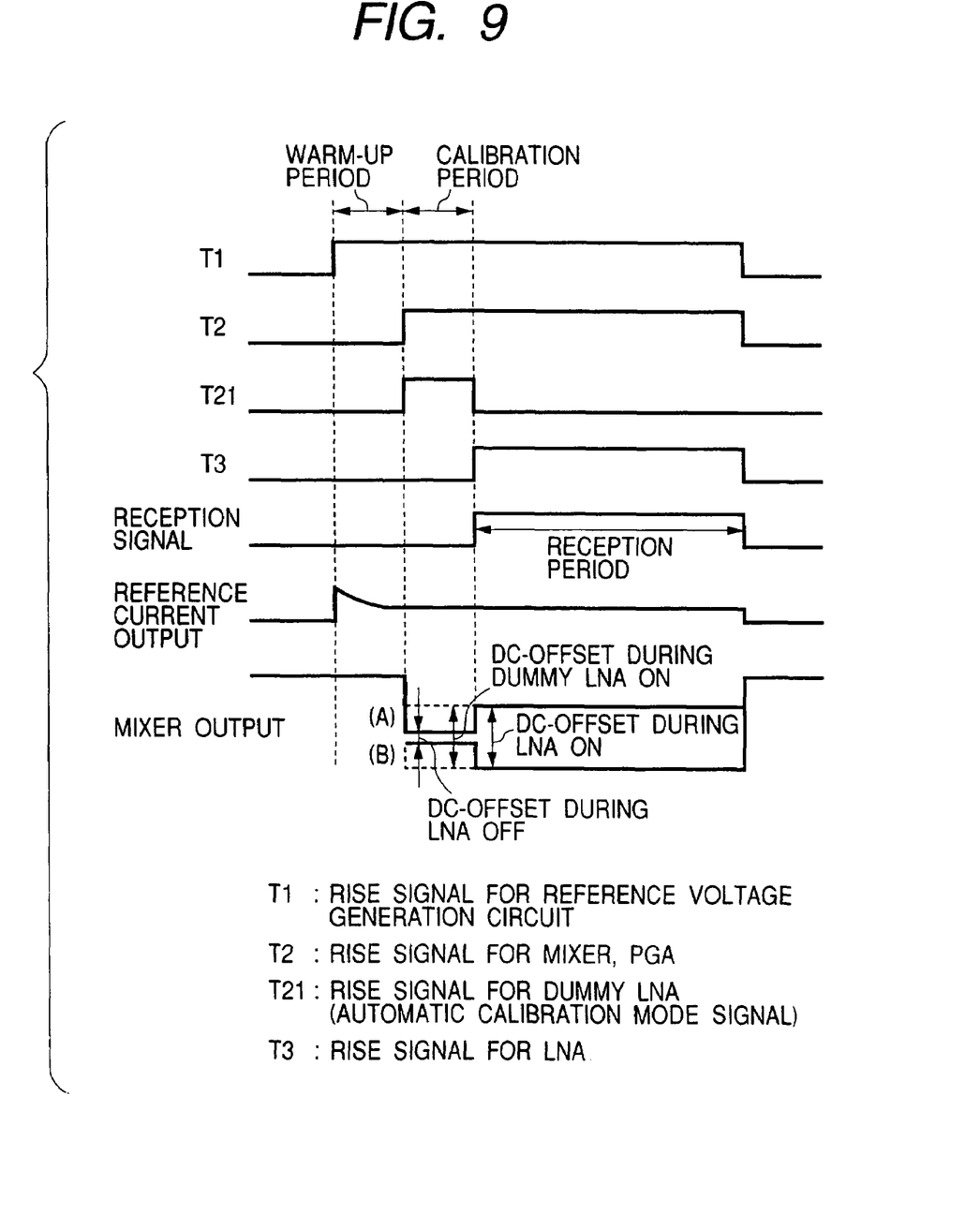
FIG. 9 is a timing chart illustrating signal waveforms during the switching of the idle mode and the reception mode in the signal reception unit.

Next, the calibration operation of the DC offset will be described which uses the dummy LNA 112B. FIG. 8 illustrates a flow chart of the switching from the idle mode (standby mode) to the reception mode, and FIG. 9 illustrates an operation-timing chart during the switching from the idle mode to the reception mode.

The switching from the idle mode into the reception mode occurs during intermittent receptions for receiving signals from a base station every specific interval, in order to confirm that which base station controls the radio zone to which a portable telephone comes in, while the portable telephone is in the standby mode. The base band & system control unit 150 starts the switching from the idle mode into the reception mode every preset specific interval.

When the base band & system control unit 150 starts the mode switching into the reception mode at a specific timing, first the base band & system control unit 150 outputs to the controller 118 a command (warm-up command) that starts the oscillation operation of the oscillation circuit 140 and activates the reference voltage generation circuits VRC of the reference current generation circuits in the reception circuit 110.

When the local oscillator of the oscillation circuit 140 starts the oscillation according to the command from the base band & system control unit 150, the control signal T1 from the controller 118 changes into a high level in the reception circuit 110, which activates the reference voltage generation circuits VRC of the reference current generation circuits in the reception circuit 110. At this moment, the reference current generation circuits need specific times depending on the device characteristics, until the circuits rise up to stabilize the currents. Concretely, as shown in FIG. 9, a higher current than that in the steady state is outputted directly after the rise of the reference current generation circuits, and thereafter it gradually approaches to the current in the steady state.

After outputting the command that activates the reference voltage generation circuits VRC of the reference current generation circuits, the base band & system control unit 150 sends the command that activates the mixer 113 and the PGA unit 115 to execute the DC offset calibration in the PGA unit 115, to the controller 118 of the reception circuit 110 at a timing of a specific period timed by an internal counter or the like.

When this command is sent to the controller 118 of the reception circuit 110, the controller 118 decodes this command, and outputs the control signal T2 that activates the mixer 113 and the PGA unit 115 and the automatic calibration mode signal T21 at almost the same time. The control signal T2 is supplied to the switches SW1 on the outputs of the reference current generation circuits each furnished with the mixer and the PGA unit 115. When the switch SW1 is turned ON, the same current as the reference current generated by the foregoing control signal T1 is supplied to each of the current sources of the mixer 113 and the PGA unit 115 thanks to the operation of the current mirror circuit, whereby the mixer 113 and the PGA unit 115 are made active.

On the other hand, when the automatic calibration mode signal T21 is supplied to the switch SW3 furnished on the path through which the operation current to the dummy LNA 112B is supplied, the switch SW3 is turned ON, whereby the dummy LNA 112B is made active. And, at the same time, the automatic calibration mode signal T21 is inputted to the automatic calibration circuit 117 to operate the counter 126 therein, and to start the automatic calibration processing. Thereby, the automatic calibration in the PGA unit 115 is carried out in the state of the dummy LNA 112B being active.

Figure 12:
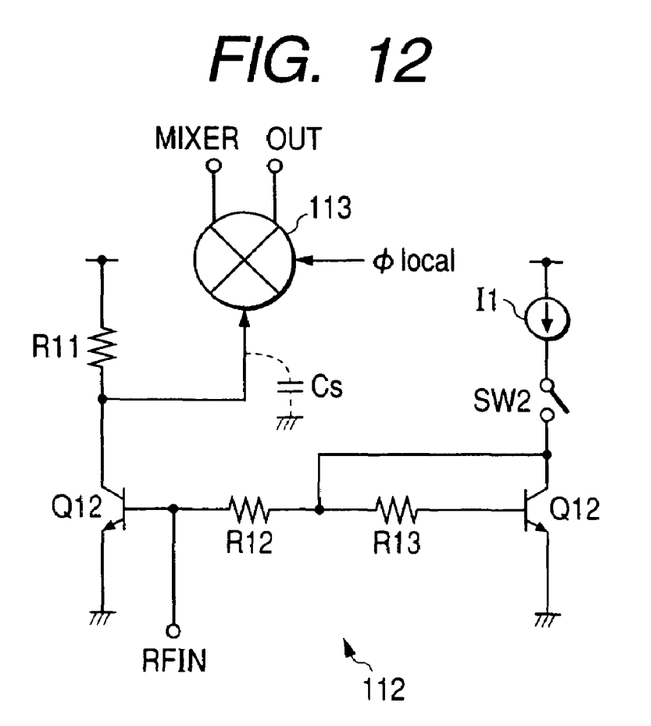
FIG. 12 is a circuit diagram of a low noise amplifier LNA as an example.

The impedance on the input of the mixer 113 in the low noise amplifier as illustrated in FIG. 12 which is not provided with the dummy LNA 112B can be regarded as the impedance that the resistance R11 and a parasitic capacitance Cs on the input terminal of the mixer are connected in parallel. The leakage noises of the local oscillation signal are considered to intermix through the impedance on the input terminal of the mixer. And, the resistance R11 of the impedance on the input terminal does not vary depending on the ON or OFF state of the low noise amplifier 112A, but the parasitic capacitance Cs significantly vary, because the charge and discharge currents extremely differ depending on the ON or OFF state.

Therefore, in the state of cutting off the current to the low noise amplifier 112A by turning OFF the switch SW2 to eliminate the influences of interference waves from the antenna, the impedance on the input of the mixer 113 is low, and the influences by the leakage noises of the local oscillation signal are also insignificant. As illustrated by the solid line in FIG. 9, the output of the mixer 113 has the DC offset approximating virtually zero, and the calibration amount of the DC offset by the automatic calibration is minute. Thereafter, as the low noise amplifier 112A is turned ON, the parasitic capacitance Cs on the input terminal of the mixer becomes higher, so that the leakage noises of the local oscillation signal become easy to come in. From this influence, the DC offset on the output of the mixer 113 becomes expanded drastically. Therefore, when the dummy LNA 112B is not provided, or when it is turned OFF even if it is provided, this DC offset cannot be calibrated although the calibration is tried.

However, this embodiment implements the automatic calibration in the state of the dummy LNA 112B being activated. Therefore, as shown by the dotted line in FIG. 9, even if the low noise amplifier 112A is made OFF, activating the dummy LNA 112B will make the DC offset rise on the output of the mixer 113 with the same level as that in the normal reception mode of the low noise amplifier 112A being activated. Since the automatic calibration is performed to calibrate this DC offset, the DC offset can be calibrated by a large margin, in comparison to the case that the dummy LNA 112B is not provided. Here, in case that the PGA unit 115 is configured with three stages as the example illustrated in FIG. 4, the calibration of the DC offset resulting from the leakage noises of the local oscillation signal is carried out mainly in the first stage variable gain amplifier PGA1. The calibrations of the DC offsets resulting from the device dispersions of the amplifiers themselves are carried out exclusively in the subsequent stage variable gain amplifiers PGA2, PGA3.

Thus, as the calibration operation by the automatic calibration circuit 117 is completed, the final DA input values for making each DC offsets of each amplifiers zero are held in the registers furnished with the DA converters 125A to 125C of the PGA unit 115, and an answer signal indicating the end of the calibration processing is outputted from the automatic calibration circuit 117 to the controller 118.

Being informed of the completion of the calibration, the controller 118 lowers the automatic calibration mode signal T21 to the low level, and simultaneously raises the reception mode signal T3 to activate the low noise amplifier 112A and bring it into the reception mode. Thereby, the reception of signals from the antenna becomes possible, and the received signal is transmitted through the low noise amplifier 112A, mixer 113, and PGA unit 115 to be decoded into the base band signal, which is amplified and inputted to the base band & system control unit 150.

And, after completion of a series of the reception processing, the base band & system control unit 150 outputs a command to shift into the idle mode (sleep mode) to the controller 118 of the reception circuit 110. On the basis of this command, the controller 118 of the reception circuit 110 turns the control signals T1, T2 and the reception mode signal T3 into the low level, cuts off the operation currents flown into the current sources of the amplifiers in the reception circuit 110, and shifts the mode into the idle mode (standby mode).

The invention has been described concretely in accordance with the embodiments, and it is natural that the invention is not limited to the above embodiments and various changes and modifications are possible without departing from the spirit and scope of the invention. For example, the variable gain amplifier AMP1 is provided also on the pre-stage of the mixer 113 in the above embodiment, however this amplifier can be omitted. And, the programmable gain amplifier (PGA) 115 on the subsequent stage of the mixer 113 is configured with three stages, but it may be configured with two stages, or four stages or more.

The noises from the oscillator VCO can be transmitted to the LNA through the wirings for the power supply (for example, the wiring for the supply voltage VCC) For example, in FIG. 6, the noises from the oscillator VCO are transmitted to the input transistor Q11 through the wiring for the supply voltage VCC as well. Since the dummy input transistor Q21 is also connected to the wiring for the supply voltage VCC in the same manner as the input transistor Q11, the noises from the oscillator VCO through the wiring for the supply voltage VCC are to be given to the dummy LNA 112B and the dummy input transistor Q21 also in the calibration mode wherein the LNA is made inactive. Therefore, the influences by the noises coming in through the wirings for the power supply voltages can be made almost equal in the calibration mode and the reception mode, and the DC offsets can be set to a specific value.

In FIG. 6, the dummy input transistor Q21 may be connected directly to the wiring for the supply voltage VCC, instead of being connected to the connection node n0. That is, the collector of the dummy input transistor Q21 may be connected directly to the wiring for the supply voltage VCC, without the resistor R11 intervening between. Such a circuit construction will make it possible to reduce the parasitic capacitance connected to the collector of the input transistor Q11, and to restrain the lowering of the amplification factor of the input transistor Q11.

In the above explanation, the invention has mainly been described with a case wherein the invention is applied to the signal processing semiconductor integrated circuit of the direct conversion system that is used for the portable telephone being the applicable field of the invention as well as the background of the invention. However, the present invention is not limited to the above, and it can widely be applied to a semiconductor integrated circuit incorporating analog circuits in which multiple amplifiers are DC-coupled in multiple stages.

As a typical effect of the invention, it is possible to suppress the generation of the DC offsets resulting from the leakage noises of the local oscillator during shifting into the reception mode, and to enhance the reception sensitivity, when the invention is applied to a signal processing semiconductor integrated circuit of the direct conversion system.

What is claimed is:

1. A signal processing semiconductor integrated circuit comprising:
   a reception circuit including a first low noise amplifier that amplifies a received signal, a frequency converter that synthesizes an amplified signal from an output of the first low noise amplifier and an oscillation signal from an output of an oscillator to form a frequency converted signal, and a signal amplifier, an input of which is coupled to an output of the frequency converter, that amplifies the frequency converted signal; and
   a second low noise amplifier, having an input terminal electrically isolated from the received signal, that is activated while the first low noise amplifier is deactivated to calibrate an offset of the signal amplifier.

2. A signal processing semiconductor integrated circuit according to claim 1, wherein the input terminal of the second low noise amplifier is coupled to an impedance that is equivalent to that of an external circuit coupled to an input terminal of the first low noise amplifier.

3. A signal processing semiconductor integrated circuit comprising:
   a reception circuit including a first amplifier that amplifies a received signal, a frequency converter that synthesizes an amplified signal from an output of the first amplifier and an oscillation signal from an output of an oscillator to form a frequency converted signal, and a second amplifier, an input of which is coupled to an output of the frequency converter, that amplifies the frequency converted signal; and having a first operation mode in which the reception circuit is activated, and a second operation mode in which the reception circuit is deactivated; and
   a third amplifier having an input terminal that is not connected to an external terminal to which the reception signal is inputted,
   wherein the second amplifier is provided with a calibration circuit that calibrates a direct current offset of the second amplifier, and
   wherein the first amplifier is deactivated, the third amplifier is activated and the calibration circuit calibrates the direct current offset of the second amplifier in response to shifting from the second operation mode to the first operation mode.

4. A signal processing semiconductor integrated circuit according to claim 3, wherein the input terminal of the third amplifier is connected to an impedance that is equivalent to that of an external circuit connected to an input terminal of the first amplifier.

5. A signal processing semiconductor integrated circuit according to claim 3, wherein the third amplifier is deactivated and the first amplifier is activated, after the direct current offset is calibrated.

6. A signal processing semiconductor integrated circuit according to claim 5, wherein the second amplifier has a plurality of amplifier stages and a plurality of calibration circuits are provided that calibrate the direct current offsets of the amplifier stages.

7. A signal processing semiconductor integrated circuit according to claim 3, further comprising:
   a transmission circuit that includes a modulation circuit that modulates a transmission signal, and an up-converting frequency converter that synthesizes a modulated signal and an oscillation signal to convert them into a higher frequency signal;
   a control circuit that controls the reception circuit and the transmission circuit; and
   an oscillation circuit that generates the oscillation signals synthesized by the reception circuit and the transmission circuit.

8. A wireless communication system comprising:
   the signal processing semiconductor integrated circuit according to claim 7; and
   a base band circuit, formed on a semiconductor substrate, to convert a base band signal into an audio signal, to convert the audio signal into the base band signal, and to control the signal processing semiconductor integrated circuit,
   wherein the base band circuit supplies a first command to activate a reference voltage generation circuit that generates a bias voltage to a current source for supplying operation currents to the frequency converter and the second amplifier, and a second command to activate the frequency converter and the second amplifier.

9. A wireless communication system according to claim 8, wherein the first command to activate the reference voltage generation circuit and the second command to activate the frequency converter, and the second amplifier are supplied from the base band circuit to the control circuit.

10. A signal processing semiconductor integrated circuit comprising:
    a reception circuit including a first amplifier that amplifies a received signal, a frequency converter that synthesizes an amplified signal from an output of the first amplifier and an oscillation signal from an output of an oscillator to form a frequency converted signal, and a second amplifier, direct current-coupled to the frequency converter, that amplifies the frequency converted signal, and a third amplifier having an input terminal that is not connected to an external terminal to which the received signal is inputted; and having a first operation mode in which the reception circuit is activated, and a second operation mode in which the reception circuit is deactivated,
    wherein a direct current offset of the second amplifier is calibrated in a state in which the first amplifier is deactivated and the third amplifier is activated in response to shifting from the second operation mode into the first operation mode.

11. A signal processing semiconductor integrated circuit according to claim 2, further comprising offset canceling circuitry coupled to the signal amplifier to cancel the offset of the signal amplifier.

12. A signal processing semiconductor integrated circuit according to claim 11, wherein an output terminal of the second low noise amplifier is coupled to the frequency converter.

13. A signal processing semiconductor integrated circuit according to claim 11, wherein the signal amplifier includes a plurality of amplifier circuits, and the offset canceling circuitry includes a plurality of offset canceling circuits each of which is coupled between an input terminal and an output terminal of one of the plurality of amplifier circuits.

14. A signal processing semiconductor integrated circuit according to claim 1, wherein the first low noise amplifier, the second low noise amplifier, the signal amplifier and the frequency converter are formed on a single chip.

15. A signal processing semiconductor integrated circuit according to claim 6, wherein the first amplifier includes a low noise amplifier.

16. A signal processing semiconductor integrated circuit according to claim 15, wherein an output terminal of the third amplifier is coupled to the frequency converter.

17. A signal processing semiconductor integrated circuit comprising:
    a reception circuit including a low noise amplifier that amplifies a received signal, a frequency converter that synthesizes an amplified signal from an output of the low noise amplifier and an oscillation signal from an output of an oscillator to form a frequency converted signal, a first amplifier, an input of which is coupled to an output of the frequency converter, to amplify the frequency converted signal, and an offset calibrating circuit coupled to the first amplifier to calibrate an offset of the first amplifier; and
    a second amplifier having an input terminal that is electrically isolated from the received signal,
    wherein the reception circuit has a first operation mode in which the reception circuit is activated, and a second operation mode in which the reception circuit is deactivated,
    wherein the low noise amplifier is activated and the second amplifier is deactivated in the first operation mode, and
    wherein the low noise amplifier is deactivated, the second amplifier is activated and the offset of the first amplifier is calibrated by the offset calibrating circuit, in response to shifting from the second operation mode to the first operation mode.

18. A signal processing semiconductor integrated circuit according to claim 17, wherein an output terminal of the second amplifier is coupled to the frequency converter.

19. A signal processing semiconductor integrated circuit according to claim 17, further comprising an impedance coupled to the input terminal of the second amplifier.

20. A signal processing semiconductor integrated circuit according to claim 17, wherein the second amplifier is coupled to the frequency converter.

21. A signal processing semiconductor integrated circuit according to claim 7, and formed on one semiconductor substrate.

* * * * *